United States Patent
Chen

(10) Patent No.: US 8,712,751 B2
(45) Date of Patent: Apr. 29, 2014

(54) SYSTEM AND METHOD OF VERIFICATION OF ANALOG CIRCUITS

(75) Inventor: Jesse Eugene Chen, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 381 days.

(21) Appl. No.: 12/437,949

(22) Filed: May 8, 2009

(65) Prior Publication Data

US 2010/0286807 A1    Nov. 11, 2010

(51) Int. Cl.
G06G 7/48    (2006.01)
G06F 17/50    (2006.01)
G06G 7/62    (2006.01)

(52) U.S. Cl.
CPC ........ G06F 17/5036 (2013.01); *G06F 17/5009* (2013.01); *G06F 17/504* (2013.01); *G06F 17/5045* (2013.01)
USPC .................................. 703/14; 703/4; 703/13

(58) Field of Classification Search
CPC ... G06F 17/50; G06F 17/504; G06F 17/5036; G06F 17/5045; G06F 17/5009
USPC .................................................. 703/13, 4, 14
See application file for complete search history.

(56) References Cited

U.S. PATENT DOCUMENTS

| | | | | |
|---|---|---|---|---|
| 5,406,583 | A * | 4/1995 | Dagdeviren | 375/216 |
| 5,872,540 | A * | 2/1999 | Casabona et al. | 342/362 |
| 7,088,835 | B1 * | 8/2006 | Norris et al. | 381/107 |
| 7,243,323 | B2 * | 7/2007 | Williams et al. | 716/113 |
| 7,328,195 | B2 * | 2/2008 | Willis | 706/14 |
| 7,463,866 | B1 * | 12/2008 | Chen | 455/91 |
| 2002/0138244 | A1 | 9/2002 | Meyer | |
| 2002/0147555 | A1 * | 10/2002 | Nagata et al. | 702/70 |
| 2006/0036416 | A1 * | 2/2006 | Lee et al. | 703/2 |
| 2007/0124706 | A1 | 5/2007 | Kolpekwar | |
| 2008/0195363 | A1 * | 8/2008 | Lytollis | 703/3 |
| 2010/0040122 | A1 * | 2/2010 | Barbier et al. | 375/220 |
| 2010/0241782 | A1 * | 9/2010 | Maddali et al. | 711/5 |

FOREIGN PATENT DOCUMENTS

EP        1879295        1/2008

OTHER PUBLICATIONS

Sheffler, Thomas, "Design of a Switch-Level Analog Model for Verilog", 2008, IEEE.*

(Continued)

*Primary Examiner* — Mary C Jacob
*Assistant Examiner* — Cedric D Johnson
(74) *Attorney, Agent, or Firm* — Sam Talpalatsky; Nicholas J. Pauley; Joseph Agusta

(57) ABSTRACT

In a particular embodiment, a first digital function module is created that represents a first analog circuit and a second digital function module is created that represents a second analog circuit. A first value representing a first analog signal is transmitted from the first digital function module to the second digital function module while concurrently or substantially currently, the second digital function module transmits a second value representing a second analog signal to the first digital function module. In a particular embodiment, the first digital function module is a current signal related to an output of the first analog circuit and the second analog signal from the second digital function module is a voltage signal related to an output of the second analog circuit. The values may be transmitted along a bidirectional analog data bus capable of communicating real floating point numbers.

34 Claims, 8 Drawing Sheets

(56) References Cited

OTHER PUBLICATIONS

Weldon, Jeffrey Arthur, "High Performance CMOS Transmitters for Wireless Communications", Fall 2005, Engineering-Electrical Engineering and Computer Sciences, Graduate Division, University of California, Berkeley, pp. 11, 12, 29, 41, 212.*
Analog Devices, "Chapter 9: Hardware Design Techniques", Dec. 8, 2003, pp. 9.1, 9.134, 9.185, 9.212.*
Analog Devices, "Chapter 9: Hardware Design Techniques", Dec. 8, 2003, pp. (9.1, 9.186, 9.187, 9.212).*
Zinke, Olaf, "Bi-Directional Mixed Signal Connection Modules for Automatic Insertion", 2002, IEEE.*
Mundkur, Sameer Shailesh, "Design and Implementation of a Digital Controller for High Power Converters", 2008, Department of Engineering, North Carolina State University.*
Kwok, Tyrone Tai-On et al., On the Design, Control, and Use of a Reconfigurable Heterogeneous Multi-Core System-on-a-Chip, 2008, IEEE.*
Hayes, John P., "Pseudo-Boolean Logic Circuits", Jul. 1986, IEEE Transactions on Computers, vol. C-35, No. 7, IEEE.*
International Search Report—PCT/US2010/034091, International Search Authority—European Patent Office Sep. 13, 2010.
Thomas J Sheffler: "Design of a Switch-Level Analog Model for Verilog" Behavioral Modeling and Simulation Workshop, 2008. BMAS 2008. IEEE International, IEEE, Piscataway, NJ, USA, Sep. 25, 2008, pp. 118-123, XP031407000 ISBN: 978-1-4244-2896-0 the whole document.
Jesse E. Chen, "Modeling RF Systems", The Designer's Guide Community, Version 1, Mar. 6, 2005, 41 pages, www.disigners-guide.org/Modeling/modeling-rf-systems.pdf.
Stefan Joeres & Stefan Heinen, Functional Verification of Radio Frequency SoCs Using Mixed-Mode and Mixed-Domain Simulations, 2006 IEEE, pp. 144-149.
Jess Chen, Baseband-equivalent Behavioral Modeling Approach for RF, Resonext Communications Inc., San Jose, CA, www.bmas-conf.org/2001/index.html.
Thomas J Sheffler: "Design of a Switch-Level Analog Model for Verilog" Behavioral Modeling and Simulation Workshop, 2008. BMAS 2008. IEEE International, IEEE, Piscataway, NJ, USA, Sep. 25, 2008, pp. 118-123, XP031407000 ISBN: 978-1-4244.
"Written Opinion—PCT/US2010/034091,—International Search Authority European Patent Office—Sep. 13, 2010".
Taiwan Search Report—TW099114812—TIPO—May 16, 2013.
Chris S Jones et al., "Sending Analog Values Along Digital Wires" Design & Verification Conference & Exhibition. Feb. 21-23, 2007; Doubletree Hotel, San Jose CA, US, Feb. 21, 2007, pages 85-92, XP009136002.

* cited by examiner

SYSTEM AND METHOD OF VERIFICATION OF ANALOG CIRCUITS

I. FIELD

The present disclosure is generally related to a system and method of verification of radio frequency and analog chips.

II. DESCRIPTION OF RELATED ART

Advances in technology have resulted in smaller and more powerful personal computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Most of these devices contain both analog and digital circuits.

Testing the analog and digital circuits during the circuit design phase can be time consuming. Verification is typically performed in a digital design environment. Analog blocks are problematic for a digital design environment because digital modeling languages do not naturally pass real numbers between modules. One approach to passing real numbers is to convert the real numbers to 64 bit words, expand a single pin into a 64-bit bus, pass the 64 bit word, and then convert the digital word back into a real number. However, a problem with the 64-bit approach is that such models may not be pin-accurate and simulation and circuit layout schematics could diverge.

III. SUMMARY

An electronic digital verification system is disclosed that includes a hyperwire capability. A hyperwire can function as an analog data bus that enables bi-directional concurrent data transfer of floating point numbers between digital function modules representing analog circuits. For example, a hyperwire can communicate, in parallel, a nominal voltage value from a first module to a second module, a voltage tolerance value from the first module to the second module, and a current value from the second module to the first module. Each of the transferred values may represent values that would occur simultaneously in the analog circuits and are transferred during a common simulation step of the digital verification system.

In a particular embodiment, a first digital function module is created that represents a first analog circuit and a second digital function module is created that represents a second analog circuit. A first value representing a first analog signal is transmitted from the first digital function module to the second digital function module while concurrently, or substantially currently, the second digital function module transmits a second value representing a second analog signal to the first digital function module. In a particular embodiment, the first digital function module sends a current signal related to an output of the first analog circuit and the second analog signal from the second digital function module is a voltage signal related to an output of the second analog circuit. The values are transmitted along a bidirectional analog data bus capable of communicating real floating point numbers.

In a particular embodiment, the first and second digital function modules are programming language interface (PLI) functions compatible with Verilog. In a particular embodiment, the first and second digital function modules include behavioral and impairment data such as data related to thermal noise, phase noise, in-phase/quadrature (I/Q) phase mismatch, and nonlinearity data.

In a particular embodiment, a computer-readable storage medium is disclosed that includes operational instructions that, when executed by the computer, cause the computer to represent a first analog circuit as a first digital function module and to represent a second analog circuit as a second digital function module. The second digital function module receives a first value representing a first analog signal from the first digital function module and transmits a second value representing a second analog signal from the second digital function module to the first digital function module. The first analog signal from the first digital function module is a voltage signal related to an output of the first analog circuit and the second analog signal from the second digital function module is a current signal related to an output of the second analog circuit.

One particular advantage provided by the disclosed embodiments is the ability to accelerate run times with baseband equivalent models of radio frequency (RF) blocks, manage analog signal contention, support bilateral signal flow, and to efficiently generate profiles of current consumption. Modules may be created using a standard modeling language, such as Verilog, and such models are compatible with an analog circuit design and test environment. As a result, the time required for full chip testing and verification of analog and digital circuits may be reduced.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
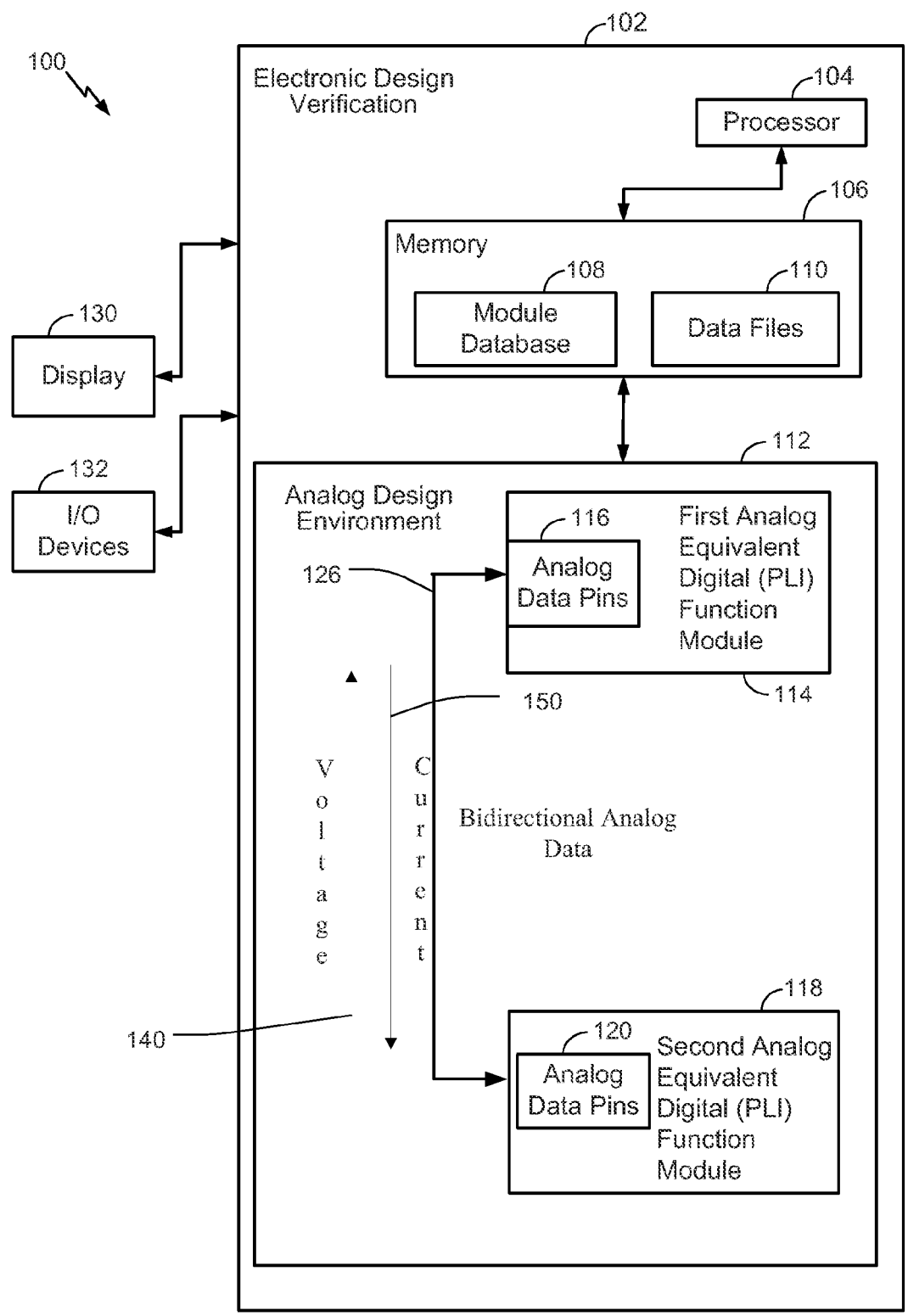
FIG. 1 is a block diagram that illustrates a particular embodiment of a system having an analog design environment including analog equivalent digital function modules.

Referring to FIG. 1, a block diagram of a particular embodiment of a computer system that is generally designated 100 is shown. The computer system 100 includes an electronic design verification system 102, a display device 130, and input/output devices 132. The electronic design verification system 102 includes a processor 104, a memory 106, and an analog design environment 112. The memory 106 includes a module database 108 and data files 110. The analog design environment 112 includes a plurality of modules including a first analog equivalent digital function module 114 and a second analog equivalent digital function module 118. The first analog equivalent digital function module 114 includes a first set of analog data pins 116. The second analog equivalent digital function module 118 includes a second set of analog data pins 120. The first set of analog data pins 116 are coupled to the second set of analog data pins 120 via a bi-directional analog data bus 126. The bi-directional analog data bus 126 concurrently, or substantially concurrently, carries a first value 150 representing a first analog signal from the first analog equivalent digital function module 114 to the second analog equivalent digital function module 118 and a second value 140 representing a second analog signal from the second analog equivalent digital function module 118 to the first analog equivalent digital function module 114. In a particular embodiment, the first value 150 and the second value 140 are real floating point number values representing analog signals. In a particular embodiment, the first value 150 represents a current value and the second value 140 represents a voltage value.

For example, the first value 150 and the second value 140 may emulate values of the first and second analog signals that occur at the same time in an analog circuit and/or during a common simulation execution step. The bi-directional analog data bus 126 transfers the first value 150 and the second value 140 so that subsequent simulation execution steps that rely on the first value 150 or the second value 140 are provided updated values prior to execution. To illustrate, the bi-directional analog data bus 126 may transfer the first value 150 and the second value 140 for each particular simulation execution step prior to each subsequent simulation execution step. Although the bi-directional analog data bus 126 may represent a single wire in the analog circuit, the first value 150 and the second value 140, in addition to one or more other values, may be carried between the analog equivalent digital function modules 114 and 118 as real numbers without modeling the bi-directional analog data bus 126 as a multiple-bit parallel bus and also without modeling the bi-directional analog data bus 126 as a single wire serially transmitting bit values to "telegraph" the first and second values 150 and 140 between modules.

In a particular embodiment, the bi-directional analog data bus 126 may be referred to as a hyperwire bus through which analog data may be communicated. In another particular embodiment, if current and voltage are related to a particular common port, the design environment may include a small delay that could prevent a resulting algebraic loop that may stall execution. The input and output units of the bi-directional analog data bus 126 are complementary such that if the output units are volts, the inputs units are amps and if the output units are amps, then the input units are volts. In this case, output refers to a quantity that is being directly controlled or driven by a circuit represented by one of the modules 114, 118.

One of the features of the complementary input and output units is to create current consumption profiles. For example, the second set of analog data pins 120 on a design block generating a supply voltage would be indicated as having units of volts. The first set of analog data pins 116 on design blocks using the supply voltage would have units of amps representing current draw of the corresponding design blocks using the supply voltage. A resolution function, such as will be described with respect to FIG. 6, within the analog equivalent digital function modules may be used to sum all the output amps at a supply node and pass the sum to the supply voltage generator. As another example, complementary input/output units can be used with external capacitors in a phase lock loop filter. To maintain a model hierarchy with respect to a modeled analog circuit, an external capacitor may not be modeled as part of a loop filter block. Rather, the loop filter may play a key role in loop dynamics and therefore not be simulated in a unilateral fashion. The ability to pass voltage one direction and current in the other direction is therefore useful.

The bi-directional analog data bus 126 is dynamically reconfigurable and may be reconfigurable during simulation. The reconfigurable data bus 126 may be used when some pins control output voltage in one mode and output current in another mode. In a particular embodiment, the first set of analog data pins 116 and the second set of analog data pins 120 can switch to a high impedance state. The high impedance state may be simulated by setting an output to an amps value and setting an input to a volts value, and setting the output current to zero.

During operation of the electronic design verification system 102, the first analog equivalent digital function module 114 represents a first physical analog circuit to be tested and the second analog equivalent digital function module 118 represents a second physical analog circuit to be tested. In a particular embodiment, the second digital function module 118 operates substantially concurrently with receiving a first value representing a first analog signal from the first digital function module 114. For example, the second analog equivalent digital function module 118 may receive an input current value from the analog data bus 126. To illustrate, one or more of the analog data pins 120 may receive a specific real data value representing a current input such as a current 150 carried over the bi-directional analog data bus 126. In addition, the second analog equivalent digital function module 118 transmits a second value that represents a second analog signal from the second digital function module 118 to the first digital function module 114. As an example, the second analog equivalent digital function module 118 may send a voltage value 140 to the first analog equivalent digital function module 114 via the bi-directional analog data bus 126. As a result, the first analog signal from the first digital function module 114 is a current signal 150 related to an output of the first analog circuit, and the second analog signal from the second digital function module 118, such as the voltage 140, is a voltage signal related to an output of the second analog circuit.

In a particular illustrative embodiment, the first digital function module 114 and the second digital function module 118 are implemented using programming language interface (PLI) functions that are compatible with a hardware description language associated with the analog circuit being represented in a verification and simulation environment. For example, the hardware description language may be Verilog. In addition, the first and second values, such as the current and voltage values communicated over the bidirectional analog data bus 126, may be floating-point real numbers. The electronic design verification system 102 may be implemented as a computer system that is coupled to a computer display monitor for the display device 130 and that receives input from a keyboard or mouse, such as the illustrated I/O devices 132. Thus, a circuit designer may use the electronic design verification system 102 at a local computer for design verifications of analog circuits represented by digital files stored within the local computer environment.

Figure 2:
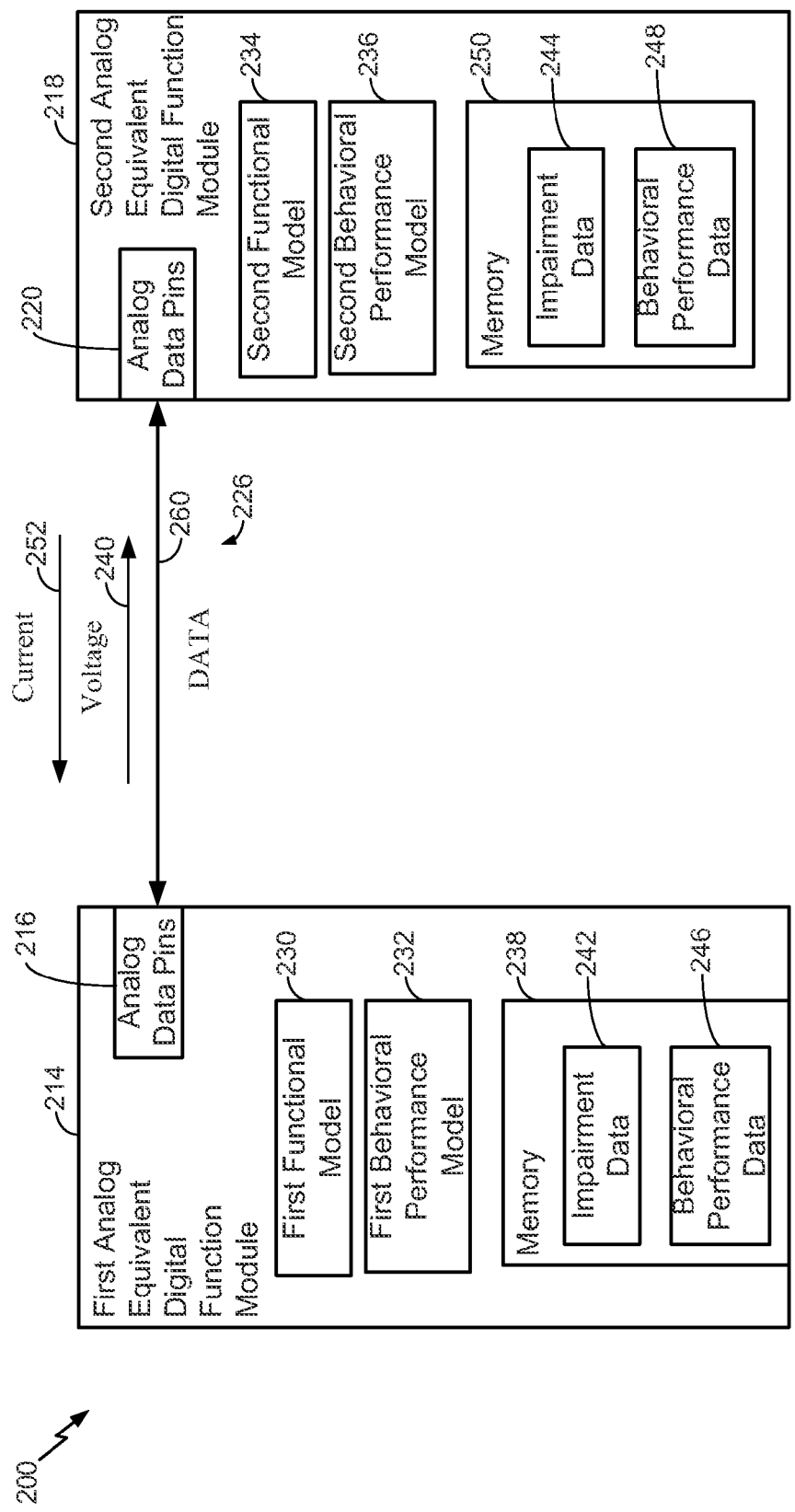
FIG. 2 is a block diagram that illustrates further details of equivalent digital function modules of the system of FIG. 1.

Referring to FIG. 2, an embodiment of a system including analog equivalent digital function modules, such as the digital function modules of the computer system 100 of FIG. 1, is shown. The system, generally designated 200, includes a first analog equivalent digital function module 214 and a second analog equivalent digital function module 218. The first analog equivalent digital function module 214 includes analog data pins 216 that are coupled to a bi-directional analog data bus 226 to analog data pins 220 of the second analog equivalent digital function module 218. Voltage values 240 and current values 252 are concurrently or substantially concurrently communicated in each direction over the bi-directional bus 226. In addition, data 260 may be communicated in either direction over the bi-directional analog data bus 226.

The first analog equivalent digital function module 214 further includes a first functional module 230 and a first behavioral performance model 232. The first behavioral performance model 232 communicates with a computer readable memory 238 that may include various data. For example, the memory 238 may include impairment data 242 and behavioral performance data 246. As an example, the impairment data 242 may include, but is not limited to, thermal noise, phase noise, in-phase/quadrature (I/Q) component mismatch, non-linear data, or other information. An example of behavioral performance data includes, but is not limited to, bidirectional real number analog data such as probabilities, averages, standard deviations, in-phase (I) component data, quadrature (Q) component data, carrier frequency, signal bandwidth, impairments, or other analog data.

Similarly, the second analog equivalent digital function module 218 includes a second functional module 234 and a second behavioral performance model 236. The second behavioral performance model 236 communicates with a second memory 250 that includes impairment data 244 and behavioral performance data 248. The impairment data 244 and the performance data 248 may include similar types of data as described with respect to the impairment data 242 and behavioral performance data 246.

In a particular embodiment, the first functional module 230 is a non-synthesizable software module of a component of an integrated circuit. For example, the first functional model 230 may be a software model that can be used to simulate the behavior of a hardware system component, such as an analog circuit, before building and testing the actual physical circuit. The first functional model 230 may be a PLI written for a hardware description language such as Verilog or VHSIC (Very High Speed Integrated Circuit) Hardware Description Language (VHDL)

The first behavioral performance model 232 may be a behavioral model that reproduces a required behavior of the original analog circuit design such that there is a one-to-one correspondence between the relevant behavior of the original analog system and the simulated system. Similar functional and behavior performance models may be used to implement the second functional model 234 and the second behavioral performance model 236 within the second analog equivalent digital function module 218.

To represent and simulate behavioral performance of an analog circuit design, the behavioral performance model 232 may use the impairment data 242 and the behavioral performance data 246 from the memory 238. For example, signal noise or standard deviation error values may be used to simulate actual noise or tolerance as well as other analog drift values of a represented analog circuit being simulated. Thus, the behavioral performance model 232 can use a variety of impairment and behavioral performance data to further enhance accuracy of simulation. Resulting output data such as the resulting voltage 240 or current 252 values or other output data such as the data 260 may be communicated from the first analog equivalent digital function module 214 to the second analog equivalent digital function module 218. Similarly, the second behavioral performance model 236 may use the impairment data 244 and the behavioral performance data 248, and resulting output data may be communicated from the second analog equivalent digital function module 218 to the first analog equivalent digital function module 214 over the bi-directional data bus 226. In this manner, both functional data and functional testing as well as behavioral performance model testing may be performed on a series of represented analog circuit components of an integrated circuit.

Figure 3:
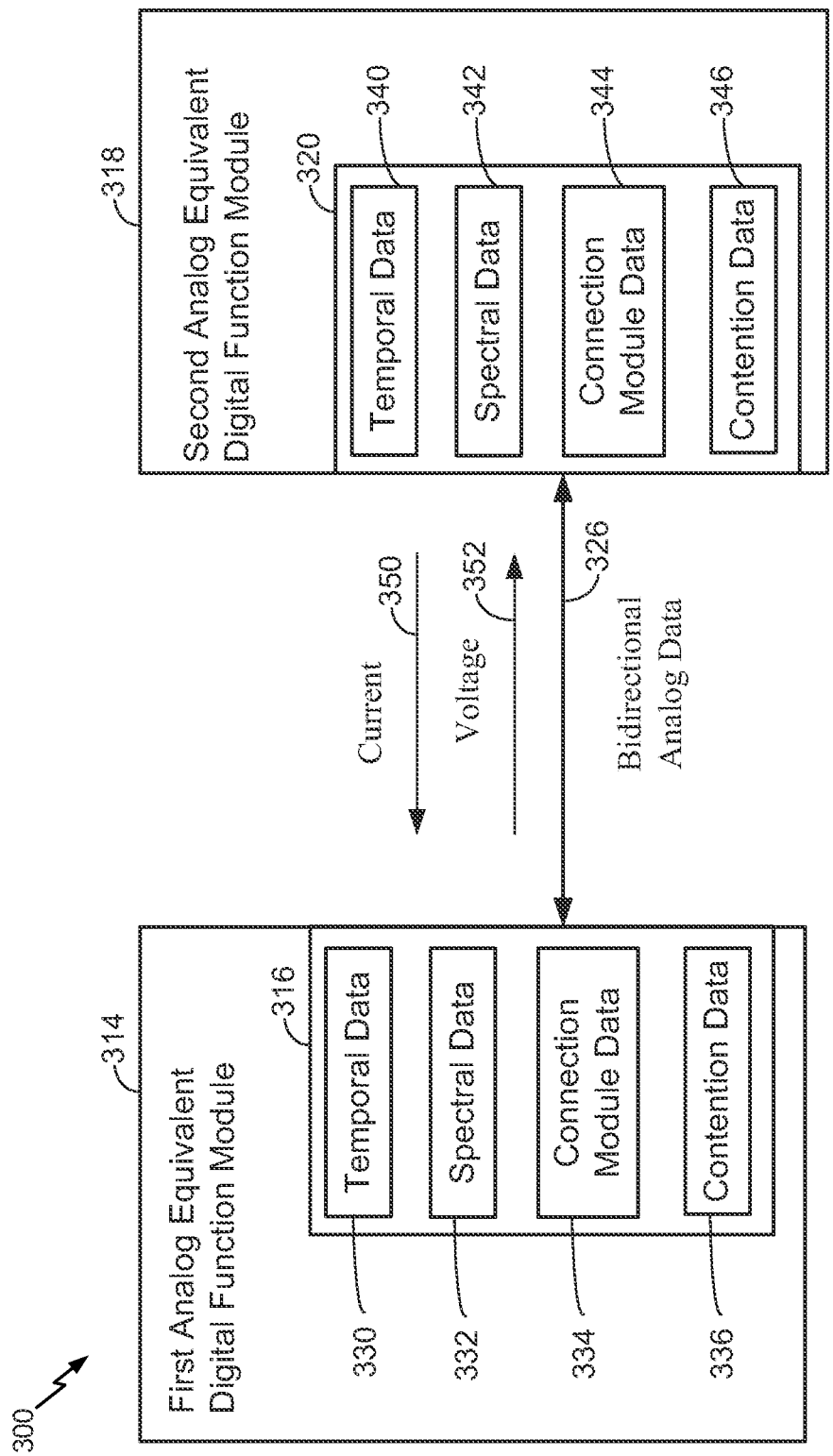
FIG. 3 is a block diagram that illustrates further details of the data types used by the digital function modules of the system of FIG. 1.

Referring to FIG. 3, a block diagram is shown that further illustrates details of data that may be represented and stored within analog equivalent digital function modules of the system of FIG. 1. The system 300 may represent a radio frequency (RF) system and includes a first analog equivalent digital function module 314 and a second analog equivalent digital function module 318. In a particular embodiment, the first analog equivalent digital function module 314 may be similar to or identical to the first analog digital equivalent function module 114 of FIG. 1 and the second analog equivalent digital function module 318 may be similar to or identical to the second analog equivalent function module 118 of FIG. 1. The first analog equivalent digital function module 314 includes various types of data within a memory 316. For example, the data includes temporal data 330, spectral data 332, connection module data 334, and contention data 336. Similarly, a memory 320 within the second analog equivalent digital function module 318 includes temporal data 340, spectral data 342, connection module data 344, and contention data 346. The data is transferred between the first analog equivalent digital function module 314 and the second analog equivalent digital function module 318 over a bi-directional data bus 326.

The following table shows a brief description of a particular embodiment of the temporal data 340, the spectral data 342, the connection module data 344, and the contention data 346.

| Data type | Description | Comments |
|---|---|---|
| Temporal data | Real input | True baseband signals |
| | Real output | True baseband signals |
| | I-component output | Baseband equivalent signal |
| | Q-component output | Baseband equivalent signal |
| | I-component input | Baseband equivalent signal |
| | Q-component input | Baseband equivalent signal |
| | Output units | Volts or Amps, Output = Volts→Input = Amps Output = Amps→Input = Volts |
| Spectral data | Carrier frequency | GHz |
| | Signal bandwidth | MHz |
| | Signal flow units | Volts or Amps |
| Connection module data | Terminal resistance | To keep signal contention from halting execution. |
| | Voltage tolerance | For converting from electrical to HyperWire |
| | Current tolerance | For converting from electrical to HyperWire |
| | Timing tolerance | For converting from electrical to HyperWire |
| Contention data | Contention flag | 1→Contention, 0→No contention |
| | Print flag: If set, print a contention warning to | 1→print 0→don't print |

| Data type | Description | Comments |
|---|---|---|
| | the log file. Include the pin name in the warning. | Default = 0. |

The temporal data 340 includes real signal data, baseband equivalent signals data, and output units data. The real signal data includes the most basic real number to be passed between modules. In an embodiment, the real signal data includes DC offsets, the intermodulation products of even order distortions, or a combination thereof. The signal rides on a carrier and can be represented by I- and Q-components. For a model in which only the amplitude and frequency are of interest, the real signal data would include the amplitude.

Baseband equivalent signals data includes the total signal that lies at baseband (i.e., near DC). The passband representation of a general data-laden RF signal is $I(t)*\cos(\omega*t)-Q(t)*\sin(\omega*t)$. To keep a passband signal representation from slowing simulations because the simulator must deal with every cycle of the carrier, the RF signal can be represented by a complex number, $I+j*Q$. The complex number is called the "baseband equivalent" representation of the RF signal. Baseband equivalent models can simulate noise and nonlinear distortion thousands of times faster than their passband counterparts. The baseband equivalent models can also include phase information.

The output units data affect the resolution function, as will be described with respect to FIG. 6. Voltage components may require one resolution while current components may require another resolution. The output units can be either volts or amps and can change amid simulation. Note that "output current" refers to an output current that is controlled and includes magnitude as well as direction of current flow.

An output current can be positive or negative, just as an output voltage can be positive or negative. For example, if a block controls the current flowing through a pin, the output units are amps, regardless of which direction the current flows. If a block controls the voltage at that pin, the output units are volts, regardless of whether the driving voltage is positive or negative.

The spectral data 342 includes carrier frequency data, signal bandwidth data, and signal flow units data. The carrier frequency data is used to simulate the effects of frequency offsets between the carrier and the local oscillator (LO) without resorting to passband models. For example, phase domain PLL models can be used to simulate LO frequency transients. Also, the difference between carrier and LO frequencies can be integrated and then the input baseband equivalent signal can be rotated accordingly. In addition, the carrier frequency data includes the carrier frequency to convert between baseband equivalent signals into passband signals.

The signal bandwidth data allows for a determination that the filter bandwidth was properly set and allows for tracking the bandwidth of the signal as it propagates through a receiver or transmitter chain without having to sweep the frequency of an input sinusoid or slow the simulation with a wide band signal. The signal flow units data allows the first analog equivalent digital function module 314 and second analog equivalent digital function module 318 to determine if voltage or current is being received. For example, if the signal rides on the voltage 352, the sending second analog equivalent digital function module 318 has output temporal units of volts while the receiving first analog equivalent digital function module 314 has temporal output units of amps. In the alternative, if the signal rides on the current 350, the sending second analog equivalent digital function module 318 has output temporal units of amps while the receiving first analog equivalent digital function module 314 has temporal output units of volts.

The connection module data 344 specify tolerances for converting the electrical signals of the analog circuits being modeled into data that can be transferred over the bi-directional data bus 326. In a particular embodiment, the connection module data 344 includes terminal resistance data to prevent convergence issues as a result of a glitch of signal contention. The contention data 346 is strictly an input quantity controlled by the resolution function shown in FIG. 6 and discussed below. The resolution function forces the contention flag to 1 when analog signal contention exists and to 0 otherwise.

Figure 4:
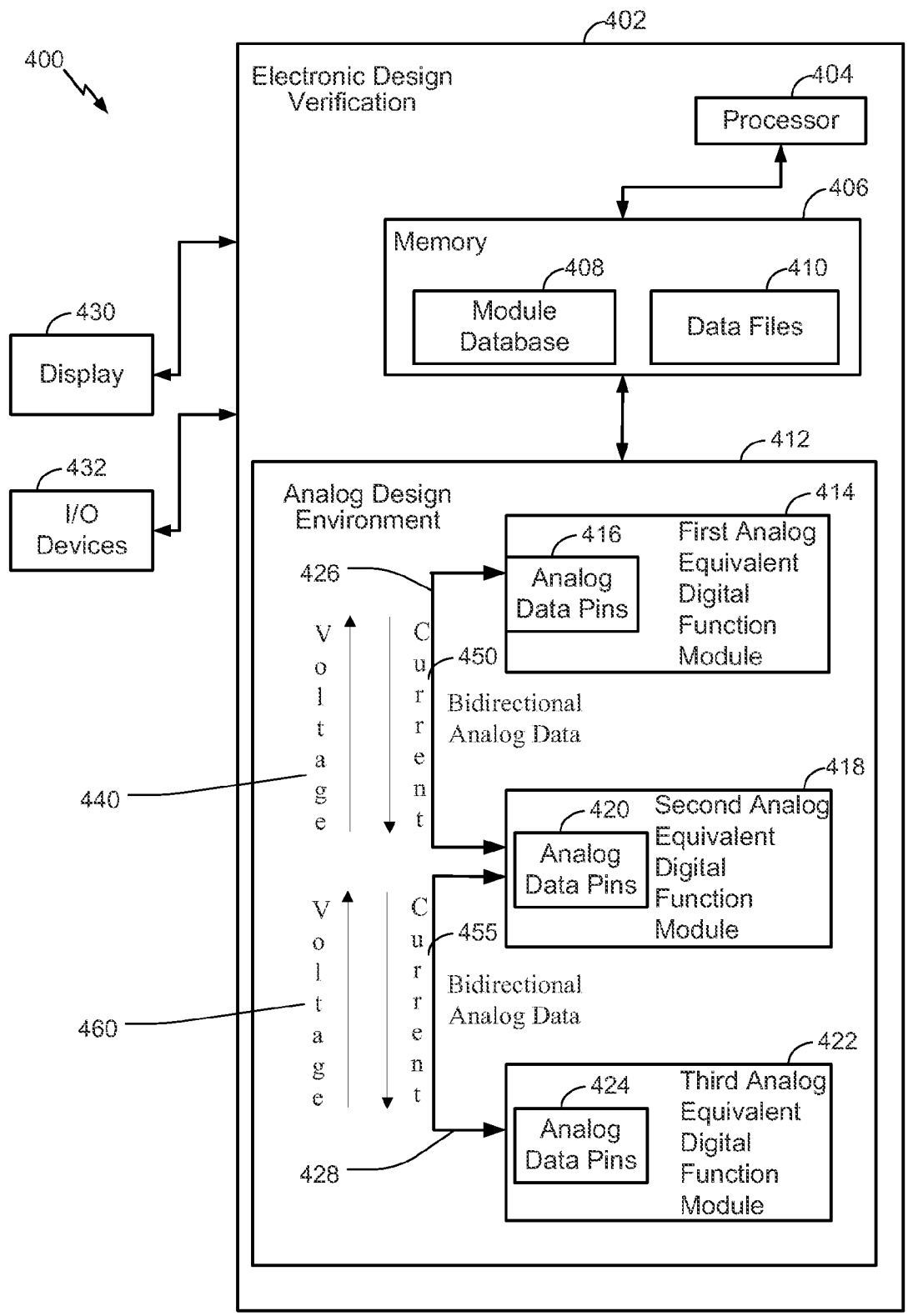
FIG. 4 is a block diagram that illustrates a particular embodiment of a system that includes more than two equivalent digital function modules.

FIG. 4 depicts an embodiment of a system 400 that includes a display 430 and I/O devices 432 coupled to an electronic design verification 402. The electronic design verification 402 includes a processor 404, a memory 406 and an analog design environment 412. The memory 406 includes a module database 408 and data files 410. The analog design environment 412 includes a first analog equivalent digital function module 414, a second analog equivalent digital function module 418, and a third analog equivalent digital function module 422. The first analog equivalent digital function module 414 includes analog data pins 416. The second analog equivalent digital function module 418 includes analog data pins 420. The third analog equivalent digital function module 422 includes analog data pins 424. The first analog equivalent digital function module 414 communicates with the second analog equivalent digital function module 418 via a bi-directional analog data bus 426. The second analog equivalent digital function module 418 communicates with the third analog equivalent digital function module 422 via a bidirectional analog data bus 428.

During operation of the electronic design verification system 402, the first analog equivalent digital function module 414 represents a first physical analog circuit to be tested. In addition, the second analog equivalent digital function module 418 similarly represents a second physical analog circuit to be tested and the third analog equivalent digital function module 422 represents a third physical analog circuit to be tested. For example, as will be discussed with respect to FIG. 5, a first analog circuit can be a voltage divider circuit, a second analog circuit can be a high pass active filter circuit, and a third analog circuit can be a RLC circuit.

In a particular embodiment, the second analog equivalent signal from the first digital function module 418 operates substantially concurrently with receiving a first value representing a first analog signal from the first digital function module 414 and a third value representing a third analog signal from the third analog equivalent digital function module 422. In the illustrated embodiment, the first analog signal, such as the current from the first analog equivalent digital function module 414, is a current signal 450 related to an output of the first analog circuit, and the second analog signal from the second analog equivalent digital function module 418, such as the voltage 440, is a voltage signal related to an output of the second analog circuit. Similarly, the second analog signal, such as the current from the second analog equivalent digital function module 418, is the current signal 450 related to an output of the second analog circuit, and the third analog signal from the third analog equivalent digital function module 422, such as the voltage 460, is a voltage signal related to an output of the third analog circuit.

For example, the second analog equivalent digital function module 418 may receive an input current value from the analog data bus 426 and an input voltage value from the analog data bus 428. To illustrate, the analog data pins 420 may receive a specific real data value representing a current input such as a current 450 carried over the bi-directional analog data bus 426 and a voltage input such as a voltage 460 carried over the bi-directional analog data bus 428. In addition, the second analog equivalent digital function module 418 transmits a second value that represents a second analog signal from the second digital function module 418 to the first analog equivalent digital function module 414 and the third analog equivalent digital function module 422. As an example, the second analog equivalent digital function module 418 may send a voltage value 440 to the first analog equivalent digital function module 414 via the bi-directional analog data bus 426 and a current value 455 to the third analog equivalent digital function module 422.

Figure 5:
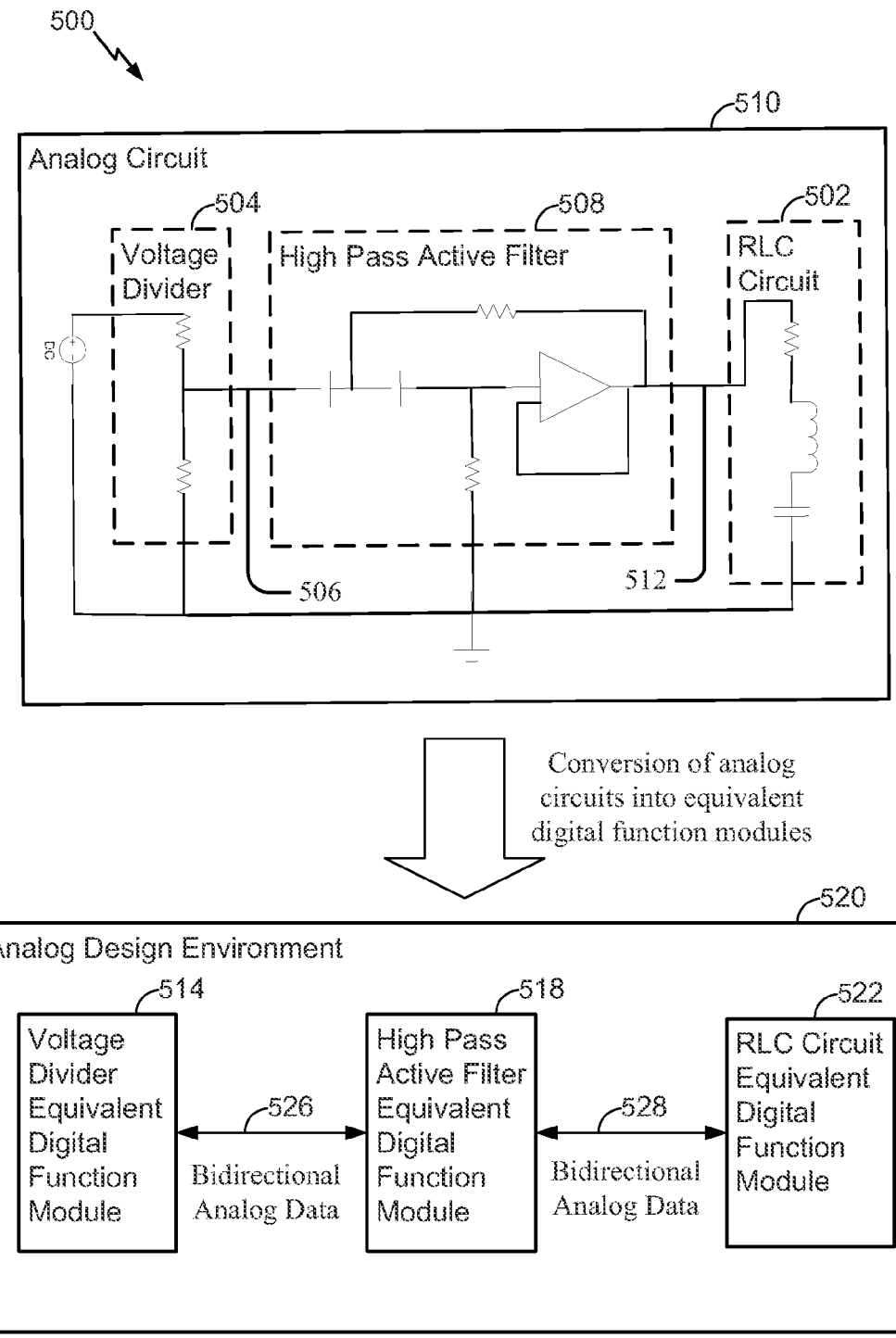
FIG. 5 is a block and circuit diagram that illustrates a particular embodiment of an analog circuit represented by an analog design environment including digital equivalent circuits.

FIG. 5 depicts a particular embodiment of a system 500 including an analog circuit 510 represented by an analog design environment 520. The analog circuit 510 includes a first analog circuit 504, such as voltage divider circuit, a second analog circuit 508, such as a high pass active filter circuit, and a third analog circuit 502, such as a resonant circuit including a resistor, inductor, and capacitor (RLC circuit). The first analog circuit 504 is connected to the second analog circuit 508 via wire 506. The second analog circuit 508 is connected to the third analog circuit via wire 512. Upon conversion to the analog design environment 520, the first analog circuit 504 is represented by a voltage divider equivalent digital function module 514, the second analog circuit 508 is represented by a high pass active filter equivalent digital function module 518 in communication with the voltage divider equivalent digital function module 518 via a bi-directional analog data bus 526, and the third analog circuit 502 is represented by a RLC circuit equivalent digital function module 522. The high pass active filter equivalent digital function module 518 is in communication with the RLC circuit equivalent digital function module 522 via a bi-directional analog data bus 528. The bi-directional analog data bus 526 simulates the wire 506 and the bi-directional analog data bus 528 simulates the wire 512.

Figure 6:
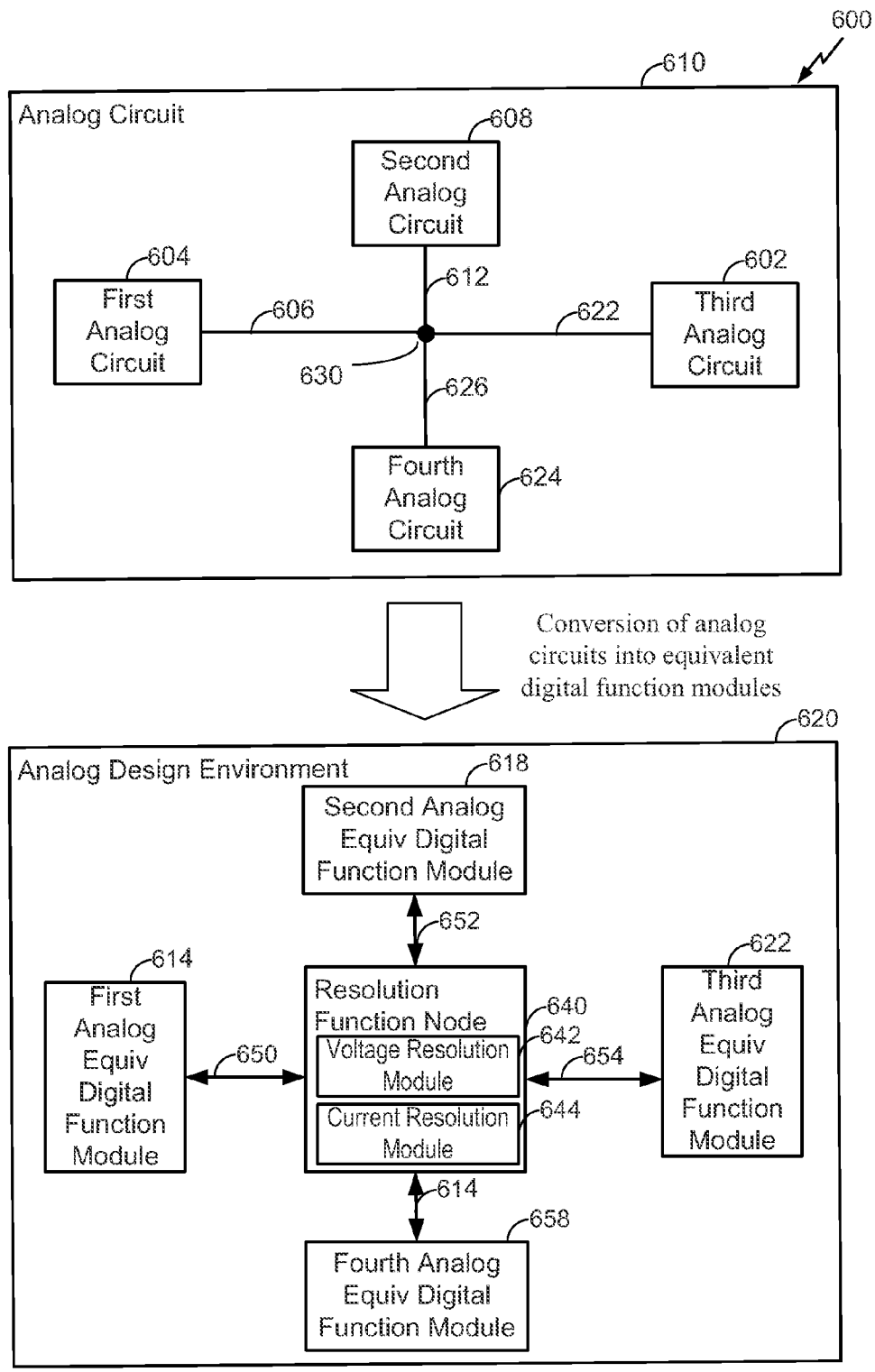
FIG. 6 is a block and circuit diagram that illustrates conversion of an analog circuit to an analog design environment.

FIG. 6 shows a conversion of analog circuits whose voltage outputs drive a common node. An analog circuit 610 includes a first analog circuit 604, a second analog circuit 608, a third analog circuit 602 and a fourth analog circuit 624. The first analog circuit 604 is connected to common node 630 via a wire 606. The second analog circuit 608 is connected to the common node 630 via a wire 612. The third analog circuit 602 is connected to the common node 630 via a wire 622. The fourth analog circuit 624 is connected to the common node 630 via a wire 626.

Upon conversion of the analog circuit 610 to equivalent digital function modules, an analog design environment 620 includes a first analog circuit equivalent digital function module 614, a second analog circuit equivalent digital function module 618, a third analog circuit equivalent digital function module 622, and a fourth analog circuit equivalent digital function module 658. A resolution function node 640 contains a voltage resolution module 642 and a current resolution module 644.

The first analog circuit equivalent digital function module 614 is coupled to the resolution function node 640 via a bi-directional analog data bus 650. The second analog circuit equivalent digital function module 618 is coupled to the resolution function node 640 via a bi-directional analog data bus 652. The third analog circuit equivalent digital function module 622 is coupled to the resolution function node 640 via a bi-directional analog data bus 654. The fourth analog circuit equivalent digital function module 658 is coupled to the resolution function node 640 via a bi-directional analog data bus 614. The voltage resolution module 642 may operate to identify or otherwise handle any signal contention that may arise when multiple analog voltage outputs drive a common node, such as the node 630. The current resolution module 644 may operate to identify or to otherwise handle any signal contention that may arise when multiple analog current outputs drive a common node, such as the node 630.

In use, during normal operation, a pin in the voltage output state can drive multiple pins that are in the current output state (voltage input state). The current resolution module 644 sums the load currents (i.e. output currents) and passes that sum to the single pin in the voltage output state. Voltage contention occurs when more than one output voltage tries to drive a common node, such as the common node 630. The voltage resolution module 642 can detect voltage contention and set to "1" the contention flags of all pins of the digital function modules 614, 618, 622, and 658 that correspond to pins of the analog circuits 604, 608, 602, and 624 that are connected to the common node 630. It may not be necessary to know exact driving voltage or load currents resulting from contention, only that contention has occurred. In the absence of voltage contention, the current resolution module 644 sums all temporal components of output currents as components of a vector, such that real outputs sum together, I-outputs sum separately, and Q-outputs sum separately.

In a particular embodiment, if the signal flow units are volts and no contention exists, the resolution modules 642, 644 will propagate spectral data from the lone output voltage to all connected pins. If signal contention exists, the resolution modules 642, 644 will propagate zero carrier frequency and zero bandwidth to all downstream (in the signal flow sense) pins. If the signal flow units are amps and there is only one bi-directional analog data bus connecting just two equivalent digital function modules, the resolution modules 642, 644 will propagate the spectral data in the direction of the current signal. If multiple output currents drive a common node and only one input current loads that node such that no contention exists, the resolution modules 642, 644 will zero the carrier frequency unless the carrier frequencies on all current outputs are equal and zero the bandwidth unless the bandwidths on all current outputs are equal.

Although the voltage resolution module 642 and the current resolution module 644 are illustrated as within the resolution function node 640, in other embodiments, the voltage resolution module 642 and the current resolution module 644 may instead be external to the node. In a particular embodiment, one or more of the analog circuit equivalent digital function modules 614, 618, 622, and 658 coupled to the common node may each contain one or more of a voltage resolution module and a current resolution module, which may interoperate with resolution modules of other analog circuit equivalent digital function modules 614, 618, 622, and 658 to detect voltage contention at the common node or sum currents at the common node.

Figure 7:
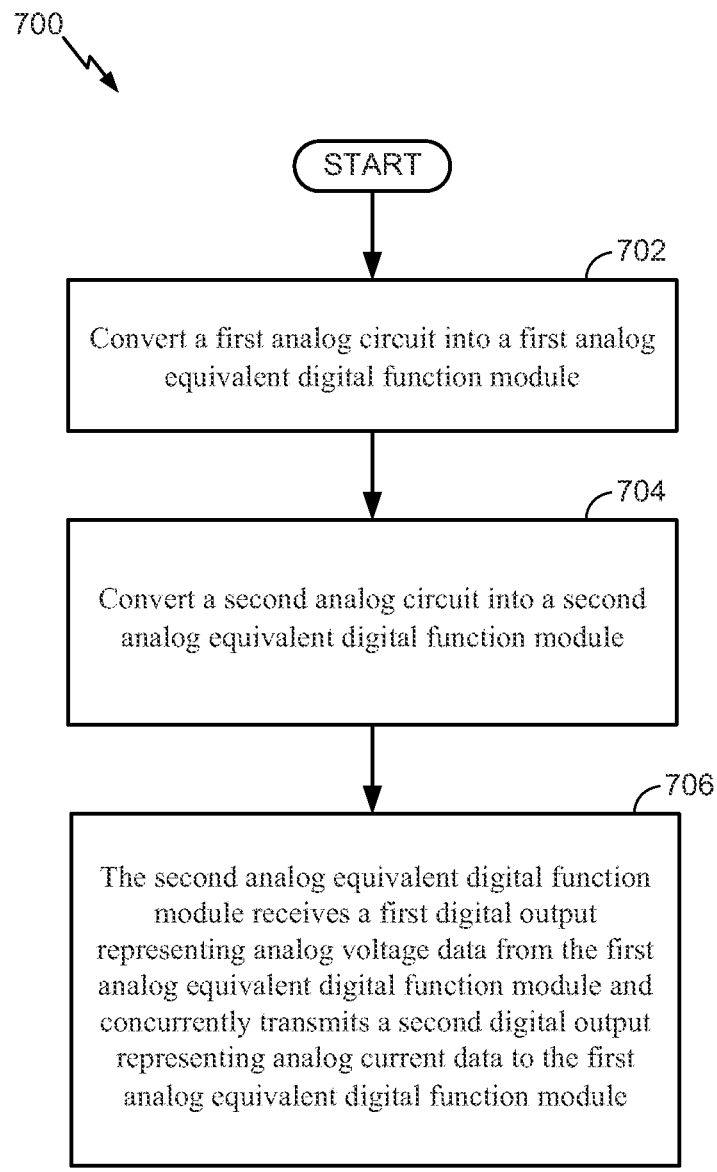
FIG. 7 is a flow chart of a particular embodiment of a method of processing design information.

Referring to FIG. 7, a particular illustrative embodiment of a method of verification of radio frequency and analog chips is depicted and generally designated 700. In an illustrative embodiment, the method 700 may be performed by the system 100 of FIG. 1, the system 200 of FIG. 2, the system 300 of FIG. 3, the system 400 of FIG. 4, the system 500 of FIG. 5, or the system 600 of FIG. 6.

In a particular embodiment, at 702, a first analog circuit is converted into a first analog equivalent digital function module. For example, the first analog circuit 504 is converted into the voltage divider equivalent digital function module 514 of FIG. 5. Continuing to 704, a second analog circuit is converted into a second analog equivalent digital function module. For example, the second analog circuit 508 is converted into the high pass active filter equivalent digital function module 518 of FIG. 5. Moving to 706, the second analog equivalent digital function module receives a first digital output representing analog voltage data from the first analog equivalent digital function module and concurrently transmits a second digital output representing analog current data to the first analog equivalent digital function module. For example, second analog equivalent digital function module 118 receives the current value 150 from the first analog equivalent digital function module 114 and concurrently transmits the voltage value 140 to the first analog equivalent digital function module 114 of FIG. 1.

Figure 8:
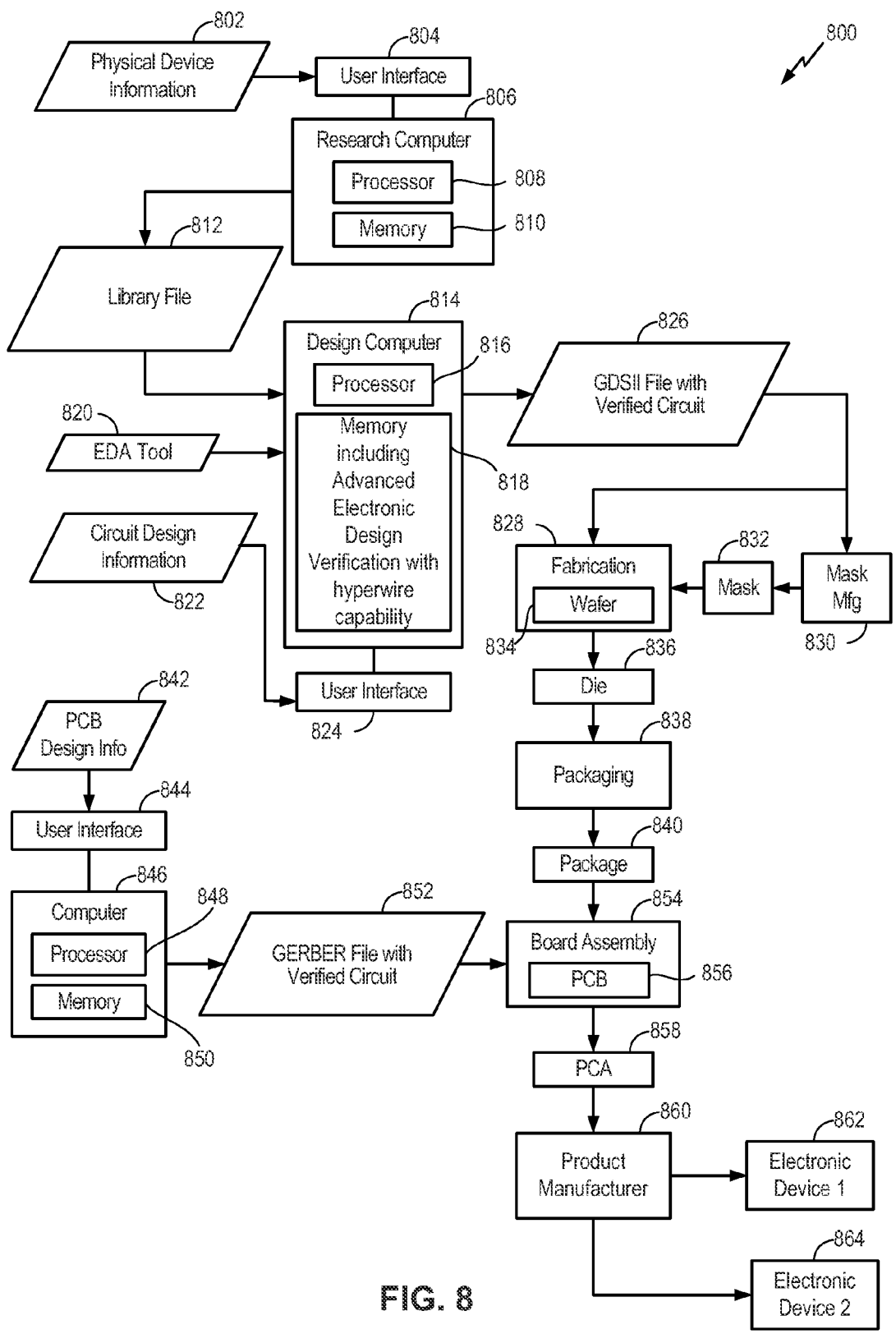
FIG. 8 is a flow diagram that illustrates a method of manufacturing an integrated circuit device.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 8 depicts a particular illustrative embodiment of an electronic device manufacturing process 800.

Physical device information 802 is received in the manufacturing process 800, such as at a research computer 806. The physical device information 802 may include design information representing at least one physical property of an analog circuit used in a semiconductor device. For example, the physical device information 802 may include physical parameters, material characteristics, and structure information that is entered via a user interface 804 coupled to the research computer 806. The research computer 806 includes a processor 808, such as one or more processing cores, coupled to a computer readable medium such as a memory 810. The memory 810 may store computer readable instructions that are executable to cause the processor 808 to transform the physical device information 802 to comply with a file format and to generate a library file 812.

In a particular embodiment, the library file 812 includes at least one data file including the transformed design information. For example, the library file 812 may include a library of semiconductor devices including one or more analog circuits that is provided for use with an electronic design automation (EDA) tool 820.

The library file 812 may be used in conjunction with the EDA tool 820 at a design computer 814 including a processor 816, such as one or more processing cores, coupled to a memory 818. The EDA tool 820 may be stored as processor executable instructions at the memory 818 and include an advanced electronic design verification with hyperwire capability to enable a user of the design computer 814 to verify an analog circuit using the electronic design verification of FIG. 1, FIG. 2, FIG. 3, FIG. 4, FIG. 5, or FIG. 6. For example, a user of the design computer 814 may enter circuit design information 822 via a user interface 824 coupled to the design computer 814. The circuit design information 822 may include design information representing at least one physical property of a RF or analog circuit to be verified. To illustrate, the circuit design property may include identification of particular circuits and relationships to other elements in a circuit design, positioning information, feature size information, interconnection information, or other information representing a physical property of a semiconductor device.

The design computer 814 may be configured to transform the design information, including the verified circuit of the circuit design information 822 to comply with a file format. To illustrate, the file formation may include a database binary file format representing planar geometric shapes, text labels, and other information about a circuit layout in a hierarchical format, such as a Graphic Data System (GDSII) file format. The design computer 814 may be configured to generate a data file including the transformed design information, such as a GDSII file 826 that includes information describing the verified circuit. To illustrate, the data file may include information corresponding to a system-on-chip (SOC) that includes the verified circuit and that also includes additional electronic circuits and components within the SOC.

The GDSII file 826 may be received at a fabrication process 828 to manufacture the verified circuit according to transformed information in the GDSII file 826. For example, a device manufacture process may include providing the GDSII file 826 to a mask manufacturer 830 to create one or more masks, such as masks to be used for photolithography processing, illustrated as a representative mask 832. The mask 832 may be used during the fabrication process to generate one or more wafers 834, which may be tested and separated into dies, such as a representative die 836. The die 836 includes a circuit including the verified electronic analog or RF circuit design.

The die 836 may be provided to a packaging process 838 where the die 836 is incorporated into a representative package 840. For example, the package 840 may include the single die 836 or multiple dies, such as a system-in-package (SiP) arrangement. The package 840 may be configured to conform to one or more standards or specifications, such as Joint Electron Device Engineering Council (JEDEC) standards.

Information regarding the package 840 may be distributed to various product designers, such as via a component library stored at a computer 846. The computer 846 may include a processor 848, such as one or more processing cores, coupled to a memory 850. A printed circuit board (PCB) tool may be stored as processor executable instructions at the memory 850 to process PCB design information 842 received from a user of the computer 846 via a user interface 844. The PCB design information 842 may include physical positioning information of a packaged semiconductor device on a circuit board, the packaged semiconductor device corresponding to the package 840.

The computer 846 may be configured to transform the PCB design information 842 to generate a data file, such as a GERBER file 852 with data that includes physical positioning information of a packaged semiconductor device on a circuit board, as well as layout of electrical connections such as traces and vias, where the packaged semiconductor device corresponds to the package 840 including the verified analog or RF circuit. In other embodiments, the data file generated by the transformed PCB design information may have a format other than a GERBER format.

The GERBER file 852 may be received at a board assembly process 854 and used to create PCBs, such as a representative PCB 856, manufactured in accordance with the design information stored within the GERBER file 852. For example, the GERBER file 852 may be uploaded to one or more machines for performing various steps of a PCB production process. The PCB 856 may be populated with electronic components including the package 840 to form a represented printed circuit assembly (PCA) 858.

The PCA 858 may be received at a product manufacture process 860 and integrated into one or more electronic devices, such as a first representative electronic device 862 and a second representative electronic device 864. As an illustrative, non-limiting example, the first representative electronic device 862, the second representative electronic device 864, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 862 and 864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 1, FIG. 2, FIG. 3, FIG. 4, FIG. 5, or FIG. 6 may illustrate circuits or components that may be implemented in a remote unit according to the teachings of the disclosure, the disclosure is not limited to the exemplary illustrated unit. Embodiments of the disclosure may be suitably employed in any device which includes active integrated circuitry including memory and on-chip circuitry for test and characterization.

Thus, the electronic design verification systems of FIG. 1, FIG. 2, FIG. 3, FIG. 4, FIG. 5, or FIG. 6 may be used to verify analog or RF circuits into components that may be fabricated, processed, and incorporated into an electronic device, as described in the illustrative process 800. One or more aspects of the embodiments disclosed with respect to FIGS. 1-7 may be included at various processing stages, such as within the library file 812, the GDSII file 826, and the GERBER file 852, as well as stored at the memory 810 of the research computer 806, the memory 818 of the design computer 814, the memory 850 of the computer 846, the memory of one or more other computers or processors (not shown) used at the various stages, such as at the board assembly process 854, and also incorporated into one or more other physical embodiments such as the mask 832, the die 836, the package 840, the PCA 858, other products such as prototype circuits or devices (not shown), or any combination thereof. Although various representative stages of production from a physical device design to a final product are depicted, in other embodiments fewer stages may be used or additional stages may be included. Similarly, the process 800 may be performed by a single entity, or by one or more entities performing various stages of the process 800.

Those of skill would further appreciate that the various illustrative logical blocks, configurations, modules, circuits, and algorithm steps described in connection with the embodiments disclosed herein may be implemented in various ways, such as electronic hardware and computer software. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in a tangible storage such as random access memory (RAM), a magnetoresistive random access memory (MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of tangible storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A system comprising:
   a computer, wherein the computer simulates:
      a first digital function module that represents a first analog circuit;
      a second digital function module that represents a second analog circuit, wherein the second digital function module receives a first value representing a first analog signal from the first digital function module and transmits a second value representing a second analog signal to the first digital function module, and wherein the first analog signal from the first digital function module is a current signal related to a first output signal of the first analog circuit and the second analog signal from the second digital function module is a voltage signal related to a second output signal of the second analog circuit; and
      a single bi-directional connection between the first digital function module and the second digital function module that represents a bi-directional connector coupled to an output of the first analog circuit and to an output of the second analog circuit, wherein the single bi-directional connection communicates the first value from the first digital function module to the second digital function module and communicates the second value from the second digital function module to the first digital function module.

2. The system of claim 1, wherein the first digital function module and the second digital function module are programming language interface (PLI) functions compatible with a hardware description language.

3. The system of claim 2, wherein the hardware description language is Verilog.

4. The system of claim 1, wherein the first value and the second value are floating point real numbers.

5. The system of claim 1, wherein at least a portion of the first value and at least a portion of the second value includes probability, average, standard deviation, carrier frequency, in-phase/quadrature (I/Q) phase, signal bandwidth, or impairment data.

6. The system of claim 1, wherein the first digital function module includes a first functional model and a first behavioral performance model of the first analog circuit and wherein the second digital function module includes a second functional model and a second behavioral performance model of the second analog circuit.

7. The system of claim 6, wherein the first behavioral performance model includes impairment data and wherein the impairment data includes data related to thermal noise, phase noise, in-phase/quadrature (I/Q) phase mismatch, and nonlinearity of the first analog circuit.

8. The system of claim 1, wherein the first digital function module and the second digital function module include a resolution function to handle signal contention that arises when two analog voltage outputs drive a common node.

9. The system of claim 1, wherein the first value and the second value include temporal data, spectral data, connection module data, or contention data.

10. The system of claim 9, wherein the first value includes a first supply value indicating a nominal supply value and includes a second supply value indicating supply tolerance data and wherein the first supply value and the second supply value are received in parallel.

11. The system of claim 9, wherein the first value includes in-phase data and includes quadrature data, and wherein the in-phase data and the quadrature data are received in parallel.

12. The system of claim 1, wherein the bi-directional connector represents an electrical connection between the first analog circuit and the second analog circuit.

13. The system of claim 12, wherein the bi-directional connector is a single wire and wherein the current signal and the voltage signal are representative of electrical characteristics at the single wire.

14. The system of claim 1, wherein the first analog circuit and the second analog circuit are integrated in at least one semiconductor device.

15. The system of claim 14, further comprising a device, selected from the group consisting of a set top box, a music player, a video player, an entertainment unit, a navigation device, a communications device, a personal digital assistant (PDA), a fixed location data unit, and a computer, into which the at least one semiconductor device is integrated.

16. The system of claim 1, wherein reception of the first value and transmission of the second value occur concurrently via the single bi-directional connection.

17. The system of claim 1, wherein the single bi-directional connection is a dynamically reconfigurable analog bi-directional connection.

18. An apparatus comprising:
means for representing a first analog circuit as a first digital function module;
means for representing a second analog circuit as a second digital function module, wherein the second digital function module receives a first value representing a first analog signal from the first digital function module and transmits a second value representing a second analog signal to the first digital function module, and wherein the first analog signal from the first digital function module is a voltage signal related to a first output signal of the first analog circuit and the second analog signal from the second digital function module is a current signal related to a second output signal of the second analog circuit; and
means for representing, at a computer, a bi-directional connector coupled to an output of the first analog circuit and to an output of the second analog circuit as a single bi-directional connection between the first digital function module and the second digital function module, wherein the single bi-directional connection communicates the first value from the first digital function module to the second digital function module and communicates the second value from the second digital function module to the first digital function module, and wherein reception of the first value and transmission of the second value occur concurrently via the single bi-directional connection.

19. The apparatus of claim 18, wherein the first analog circuit and the second analog circuit are integrated in at least one semiconductor device.

20. The apparatus of claim 19, further comprising a device, selected from the group consisting of a set top box, a music player, a video player, an entertainment unit, a navigation device, a communications device, a personal digital assistant (PDA), a fixed location data unit, and a computer, into which the at least one semiconductor device is integrated.

21. A method comprising:
converting a first analog circuit into a first analog equivalent digital function module;
converting a second analog circuit into a second analog equivalent digital function module, wherein the second analog equivalent digital function module receives a first digital output representing analog voltage data from the first analog equivalent digital function module and transmits a second digital output representing analog current data to the first analog equivalent digital function module; and
representing, at a computer, a bi-directional connector coupled to an output of the first analog circuit and to an output of the second analog circuit as a single bi-directional connection between the first analog equivalent digital function module and the second analog equivalent digital function module, wherein the single bi-directional connection communicates the first digital output from the first analog equivalent digital function module to the second analog equivalent digital function module and communicates the second digital output from the second analog equivalent digital function module to the first analog equivalent digital function module.

22. The method of claim 21, wherein the first value and the second value include probability, average, standard deviation, carrier frequency, in-phase/quadrature-phase (I/Q), signal bandwidth, or impairment data.

23. The method of claim 21, wherein the first analog equivalent digital function module includes a first functional model and a first behavioral performance model of the first analog circuit, and wherein the second analog equivalent digital function module includes a second functional model and a second behavioral performance model of the second analog circuit.

24. The method of claim 23, wherein the first behavioral performance model includes impairment data related to thermal noise, phase noise, in-phase/quadrature (I/Q) phase mismatch, or nonlinearity of the first analog circuit.

25. The method of claim 21, wherein reception of the first digital output and transmission of the second digital output occur concurrently via the single bi-directional connection.

26. The method of claim 25, wherein concurrent reception of the first digital output and transmission of the second digital output includes receiving the first digital output and transmitting the second digital output simultaneously.

27. A method comprising:
a step for converting a first analog circuit into an first analog equivalent digital function module;
a step for converting a second analog circuit into a second analog equivalent digital function module, wherein the second analog equivalent digital function module receives a first digital output representing analog voltage data from the first analog equivalent digital function module and transmits a second digital output representing analog current data to the first analog equivalent digital function module; and a step for representing, at a computer, a bi-directional connector coupled to an output of the first analog circuit and to an output of the second analog circuit as a single bi-directional connection between the first analog equivalent digital function module and the second analog equivalent digital function module, wherein the single bi-directional connection communicates the first digital output from the first analog equivalent digital function module to the second analog equivalent digital function module and communicates the second digital output from the second analog equivalent digital function module to the first analog equivalent digital function module.

28. A non-transitory computer-readable medium storing code that, when executed by a computer, causes the computer to:

represent a first analog circuit as first digital function module;

represent a second analog circuit as a second digital function module, wherein the second digital function module receives a first value representing a first analog signal from the first digital function module and transmits a second value representing a second analog signal to the first digital function module, and wherein the first analog signal from the first digital function module is a voltage signal related to a first output signal of the first analog circuit and the second analog signal from the second digital function module is a current signal related to a second output signal of the second analog circuit; and represent a bi-directional connector coupled to an output of the first analog circuit and to an output of the second analog circuit as a single bi-directional connection between the first digital function module and the second digital function module, wherein the single bi-directional connection communicates the first value from the first digital function module to the second digital function module and communicates the second value from the second digital function module to the first digital function module.

29. A method comprising:

receiving design information representing at least one physical property of a semiconductor device, the semiconductor device comprising a first analog circuit and a second analog circuit verified by an electronic design verification comprising:

a first digital function module that represents the first analog circuit;

a second digital function module that represents the second analog circuit, wherein the second digital function module receives a first value representing a first analog signal from the first digital function module and transmits a second value representing a second analog signal to the first digital function module, and wherein the first analog signal from the first digital function module is a voltage signal related to a first output signal of the first analog circuit and the second analog signal from the second digital function module is a current signal related to a second output signal of the second analog circuit; and a single bi-directional connection between the first digital function module and the second digital function module that represents a bi-directional connector coupled to an output of the first analog circuit and to an output of the second analog circuit, wherein the single bi-directional connection communicates the first value from the first digital function module to the second digital function module and communicates the second value from the second digital function module to the first digital function module;

transforming the design information at a computer to comply with a file format; and generating a data file including the transformed design information.

30. The method of claim 29, wherein the data file includes a Graphic Data System file (GDSII) format.

31. A method comprising:

receiving a data file including design information corresponding to a semiconductor device; and fabricating the semiconductor device according to the design information, wherein the semiconductor device comprises a first analog circuit and a second analog circuit verified by an electronic design verification comprising:

a first digital function module that represents the first analog circuit;

a second digital function module that represents the second analog circuit, wherein the second digital function module receives a first value representing a first analog signal from the first digital function module and transmits a second value representing a second analog signal to the first digital function module, and wherein the first analog signal from the first digital function module is a voltage signal related to a first output signal of the first analog circuit and the second analog signal from the second digital function module is a current signal related to a second output signal of the second analog circuit; and a single bi-directional connection between the first digital function module and the second digital function module that represents a bi-directional connector coupled to an output of the first analog circuit and to an output of the second analog circuit, wherein the single bi-directional connection communicates the first value from the first digital function module to the second digital function module and communicates the second value from the second digital function module to the first digital function module.

32. A method comprising:

receiving design information including physical positioning information of a packaged semiconductor device on a circuit board, the packaged semiconductor device including a semiconductor device comprising a first analog circuit and a second analog circuit verified by an electronic design verification comprising:

a first digital function module that represents the first analog circuit;

a second digital function module that represents the second analog circuit, wherein the second digital function module receives a first value representing a first analog signal from the first digital function module and transmits a second value representing a second analog signal to the first digital function module, and wherein the first analog signal from the first digital function module is a voltage signal related to a first output signal of the first analog circuit and the second analog signal front the second digital function module is a current signal related to a second output signal of the second analog circuit; and a single bi-directional connection between the first digital function module and the second digital function module that represents a bi-directional connector coupled to an output of the first analog circuit and to an output of the second analog circuit, wherein the single bi-directional connection communicates the first value from the first digital function module to the second digital function module and communicates the second value from the second digital function module to the first digital function module; and transforming the design information at a computer to generate a data file.

33. The method of claim 32, wherein the data file has a GERBER format.

34. A method comprising:

receiving a data file including design information including physical positioning information of a packaged semiconductor device on a circuit board; and manufacturing the circuit board configured to receive the packaged semiconductor device according to the design information, wherein the packaged semiconductor device includes a semiconductor device comprising a first analog circuit and a second analog circuit verified by an electronic design verification comprising:

a first digital function module that represents the first analog circuit;

a second digital function module that represents the second analog circuit, wherein the second digital function module receives a first value representing a first analog signal from the first digital function module and transmits a second value representing a second analog signal to the first digital function module, and wherein the first analog signal from the first digital function module is a voltage signal related to a first signal output of the first analog circuit and the second analog signal from the second digital function module is a current signal related to a second output signal of the second analog circuit; and a single bi-directional connection between the first digital function module and the second digital function module that represents a bi-directional connector coupled to an output of the first analog circuit and to an output of the second analog circuit, wherein the single bi-directional connection communicates the first value from the first digital function module to the second digital function module and communicates the second value from the second digital function module to the first digital function module.

* * * * *